United States Patent
Mun et al.

(10) Patent No.: US 7,344,999 B2
(45) Date of Patent: Mar. 18, 2008

(54) METHOD FOR CLEANING SUBSTRATE HAVING EXPOSED SILICON AND SILICON GERMANIUM LAYERS AND RELATED METHOD FOR FABRICATING SEMICONDUCTOR DEVICE

(75) Inventors: Chang-Sup Mun, Suwon (KR); Woo-Gwan Shim, Yongin (KR); Han-Ku Cho, SeongNam (KR); Chang-Ki Hong, SeongNam (KR); Doo-Won Kwon, SeongNam (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 41 days.

(21) Appl. No.: 11/527,473

(22) Filed: Sep. 27, 2006

(65) Prior Publication Data
US 2007/0072431 A1    Mar. 29, 2007

(30) Foreign Application Priority Data
Sep. 28, 2005    (KR) ............... 10-2005-0090466

(51) Int. Cl.
*H01L 21/302* (2006.01)
(52) U.S. Cl. ............. 438/749; 438/750; 257/E21.228
(58) Field of Classification Search ............ 438/749, 438/750
See application file for complete search history.

(56) References Cited

U.S. PATENT DOCUMENTS

| | | | |
|---|---|---|---|
| 6,228,166 B1 * | 5/2001 | Suzuki et al. ............ | 117/94 |
| 6,562,707 B2 | 5/2003 | Ryu et al. | |
| 7,129,184 B2 * | 10/2006 | Chang et al. ............ | 438/750 |
| 7,294,577 B2 * | 11/2007 | Oh et al. ............ | 438/694 |
| 2003/0162370 A1 * | 8/2003 | Sukegawa et al. ............ | 438/478 |
| 2005/0139231 A1 * | 6/2005 | Abadie et al. ............ | 134/2 |
| 2005/0239672 A1 * | 10/2005 | Mun et al. ............ | 510/175 |

FOREIGN PATENT DOCUMENTS

| | | |
|---|---|---|
| JP | 2005079215 | 3/2005 |
| KR | 1020020078677 | 10/2002 |
| KR | 1020030003380 | 1/2003 |

* cited by examiner

*Primary Examiner*—Trung Dang
(74) *Attorney, Agent, or Firm*—Volentine & Whitt, PLLC

(57) ABSTRACT

A method for cleaning a substrate on which a silicon layer and a silicon germanium layer are formed and exposed, and method for fabricating a semiconductor device using the cleaning method are disclosed. The cleaning method comprises preparing a semiconductor substrate on which a silicon layer and a silicon germanium layer are formed and exposed; and performing a first cleaning sub-process that uses a first cleaning solution to remove a native oxide layer from the semiconductor substrate. The cleaning method further comprises performing a second cleaning sub-process on the semiconductor substrate after performing the first cleaning sub-process, wherein the second cleaning sub-process comprises using a second cleaning solution. In addition, the second cleaning solution comprises ammonium hydroxide ($NH_4OH$), hydrogen peroxide ($H_2O_2$), and deionized water ($H_2O$), and the second cleaning solution comprises at least 200 times more deionized water ($H_2O$) than ammonium hydroxide ($NH_4OH$) by volume.

26 Claims, 9 Drawing Sheets

Thickness of a Native Oxide Removed by Diluted HF(Å)

US 7,344,999 B2

METHOD FOR CLEANING SUBSTRATE HAVING EXPOSED SILICON AND SILICON GERMANIUM LAYERS AND RELATED METHOD FOR FABRICATING SEMICONDUCTOR DEVICE

BACKGROUND

1. Field of the Invention

Embodiments of the invention relate to a method for cleaning a substrate and a related method for fabricating a semiconductor device. In particular, embodiments of the invention relate to a method for cleaning a substrate on which a silicon layer and a silicon germanium layer are formed and exposed, and a method for fabricating a semiconductor device using the method for cleaning.

This application claims priority to Korean Patent Application No. 2005-90466, filed on Sep. 28, 2005, the subject matter of which is hereby incorporated by reference in its entirety.

2. Description of the Related Art

Research into partial insulated field effect transistors (PiFETs) and multi bridged channel field effect transistors (MBC-FETs) are a part of the continuing effort to produce more densely integrated semiconductor devices.

Figure (FIG.) 1 illustrates a process for forming a conventional MBC-FET. FIG. 1 is a photograph showing a cross-section of a substrate after a silicon germanium layer and a silicon layer have been stacked sequentially and repeatedly on a silicon substrate, have been patterned, and a cleaning process has been performed on the substrate. In a conventional cleaning process, a solution (i.e., a mixed solution) called SC1 consisting of ammonium hydroxide ($NH_4OH$), hydrogen peroxide ($H_2O_2$), and deionized water ($H_2O$), and having a volume ratio of ammonium hydroxide ($NH_4OH$) to hydrogen peroxide ($H_2O_2$) to deionized water ($H_2O$) of 1:4:20, is used as a cleaning solution. However, SC1 etches silicon germanium nine times faster than it etches silicon. Therefore, as illustrated in FIG. 1, sidewalls of the silicon germanium layers may be recessed. During a subsequent process (i.e., after the cleaning process has been performed), the silicon germanium layer is removed, and a gate insulation layer and a conductive layer are formed in an area previously occupied by the silicon germanium layer. Therefore, when a length of the silicon germanium layer (i.e., a length in a substantially horizontal direction relative to the photograph of FIG. 1) is shortened, a channel length of a subsequently formed MBC-FET is reduced, making it difficult to operate the MBC-FET properly.

In a conventional method for forming a PiFET, after the silicon germanium layer is removed, a buried insulation layer is formed in the area previously occupied by the silicon germanium layer. Therefore, when a length of the silicon germanium layer is shortened, the length of the buried insulation layer is also shortened, so desired operations cannot be performed properly.

Also, in the interval of time after an etching process has been performed but before a cleaning process has been performed, a native oxide layer forms on the silicon layer and the silicon germanium layer exposed by the etching process. The thickness of the native oxide layer (i.e., the amount of a native oxide layer) that forms varies in accordance with the amount of time that passes between the etching and cleaning processes. The effectiveness (i.e., cleaning efficiency) of the cleaning process that uses SC1 varies in accordance with the thickness of the native oxide layer that forms between the etching and cleaning processes. Therefore, the results of the cleaning process are not uniform for each wafer.

Also, the hydrogen peroxide contained in SC1 may cause a new oxide layer to form on the silicon layer and the silicon germanium layer. Therefore, it may be difficult to perform a subsequent epitaxial growth process because of the new oxide layer. That difficulty in performing the subsequent epitaxial growth process may reduce the reliability of a semiconductor device such as a PiFET or an MBC-FET fabricated using the conventional cleaning process.

SUMMARY OF THE INVENTION

Embodiments of the invention provide a method for cleaning a substrate on which a silicon layer and a silicon germanium layer are formed and exposed using an etching solution that etches silicon and silicon germanium with similar etching rates. Embodiments of the invention also provide a method for cleaning a substrate on which a silicon layer and a silicon germanium layer are formed and exposed that is able to remove an oxide layer formed by a cleaning solution. Embodiments of the invention further provide a method for fabricating a reliable semiconductor device.

In one embodiment, the invention provides a cleaning method comprising preparing a semiconductor substrate, wherein a silicon layer and a silicon germanium layer are formed on the semiconductor substrate, and the silicon layer and the silicon germanium layer are each exposed; and performing a first cleaning sub-process, wherein the first cleaning sub-process comprises using a first cleaning solution to remove a native oxide layer from the semiconductor substrate. The cleaning method further comprises performing a second cleaning sub-process on the semiconductor substrate after performing the first cleaning sub-process, wherein the second cleaning sub-process comprises using a second cleaning solution. In addition, the second cleaning solution comprises ammonium hydroxide ($NH_4OH$), hydrogen peroxide ($H_2O_2$), and deionized water ($H_2O$), and the second cleaning solution comprises at least 200 times more deionized water ($H_2O$) than ammonium hydroxide ($NH_4OH$) by volume.

In another embodiment, the invention provides a method for fabricating a semiconductor device, the method comprising sequentially forming a silicon germanium layer and a silicon layer on a semiconductor substrate; patterning the silicon layer and the silicon germanium layer to form a first opening that exposes the silicon layer, the silicon germanium layer, and the semiconductor substrate; and performing a first cleaning sub-process on surfaces of the silicon layer, the silicon germanium layer, and the semiconductor substrate exposed by the first opening using a first cleaning solution to remove a native oxide layer. The method further comprises performing a second cleaning sub-process on the semiconductor substrate using a second cleaning solution after performing the first cleaning sub-process. In addition, the second cleaning solution comprises ammonium hydroxide ($NH_4OH$), hydrogen peroxide ($H_2O_2$), and deionized water ($H_2O$), and the second cleaning solution comprises 200 times more deionized water ($H_2O$) than ammonium hydroxide ($NH_4OH$) by volume.

BRIEF DESCRIPTION OF THE DRAWINGS

Embodiments of the invention will be described herein with reference to the accompanying drawings, in which like reference symbols refer to like or similar elements throughout. In the drawings.

DESCRIPTION OF EMBODIMENTS

Figure 1:
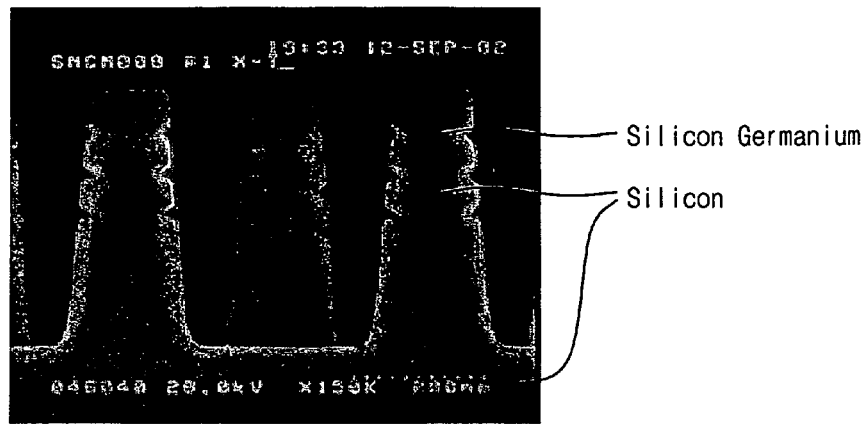
FIG. 1 is a photograph of a cross-section of a semiconductor substrate having a silicon layer and a silicon germanium layer after a conventional cleaning process has been performed.

In the drawings, the thicknesses of layers and regions are not necessarily drawn to scale. As used herein, when a first layer is referred to as being "on" a second layer or a substrate, the first layer can be directly on the second layer or substrate, or intervening layers may be present. Also, though a plurality of one element or feature may be illustrated in a drawing, reference to just one of the plurality of that element or feature may be made herein for convenience of description.

A first experiment (Experiment 1) was performed to examine the influence of a native oxide layer on a process for cleaning a semiconductor substrate on which a silicon layer and a silicon germanium layer are formed and exposed.

In Experiment 1, nine bare wafers that were substantially the same were prepared. Silicon layers were then formed on three of the bare wafers, respectively, and these wafers will be referred to herein as a first wafer group; first silicon germanium layers containing 20% germanium were formed on another three of the bare wafers, respectively, and these wafers will be referred to herein as a second wafer group; and second silicon germanium layers containing 30% germanium were formed on the remaining three bare wafers, respectively, and these wafers will be referred to herein as a third wafer group. Polysilicon was formed using the silicon layers. Each of the silicon layers, the first silicon germanium layers, and the second silicon germanium layers were formed having substantially the same thickness. A total of nine test wafers were formed through the process described above. The test wafers were then left alone in an ambient atmosphere for several days so that native oxide layers would be formed on the exposed silicon layers, the first silicon germanium layers, and the second silicon germanium layers of the nine wafers.

Then, a first cleaning sub-process using a diluted fluoric acid was performed on each of the nine test wafers. In the diluted fluoric acid, the volume ratio of deionized water to fluoric acid was 200:1 at a temperature of 25° C. As used herein, the term "volume ratio" means the ratio of the respective volumes of the corresponding substances. Thus, the "volume ratio" of substance 1 to substance 2 is the ratio of the volume of substance 1 to the volume of substance 2.

The diluted fluoric acid was intended to remove the native oxide layers. The amount of time for which the first cleaning sub-process was performed on each test wafer was varied in accordance with the desired amount (i.e., thickness) of the native oxide layer to remove from that test wafer. In particular, for a first wafer of each of the first through third wafer groups, the first cleaning sub-process was performed for a time sufficient to remove 0 Å of the native oxide layer (i.e., the first cleaning sub-process was not performed on the first wafer of each of the first through third wafer groups); for a second wafer of each of the first through third wafer groups, the first cleaning sub-process was performed for a time sufficient to remove 3 Å of the native oxide layer; and for a third wafer of each of the first through third wafer groups, the first cleaning sub-process was performed for a time sufficient to remove 18 Å of the native oxide layer.

After the first cleaning sub-process was performed, a second cleaning sub-process using a diluted solution SC1 was performed. In the diluted solution SC1, the volume ratio of ammonium hydroxide ($NH_4OH$) to hydrogen peroxide ($H_2O_2$) to deionized water ($H_2O$) was 1:4:1000. The second cleaning sub-process was performed for ten minutes using the diluted solution SC1 at a temperature of 50° C. After the second cleaning sub-process was performed, measurements were taken of the amount that the silicon layer of each wafer of the first wafer group was etched, the amount that the first silicon germanium layer of each wafer of the second wafer group was etched, and the amount that the second silicon germanium layer of each wafer of the third wafer group was etched. Those measurements are shown in the graph of FIG. 2.

Figure 2:
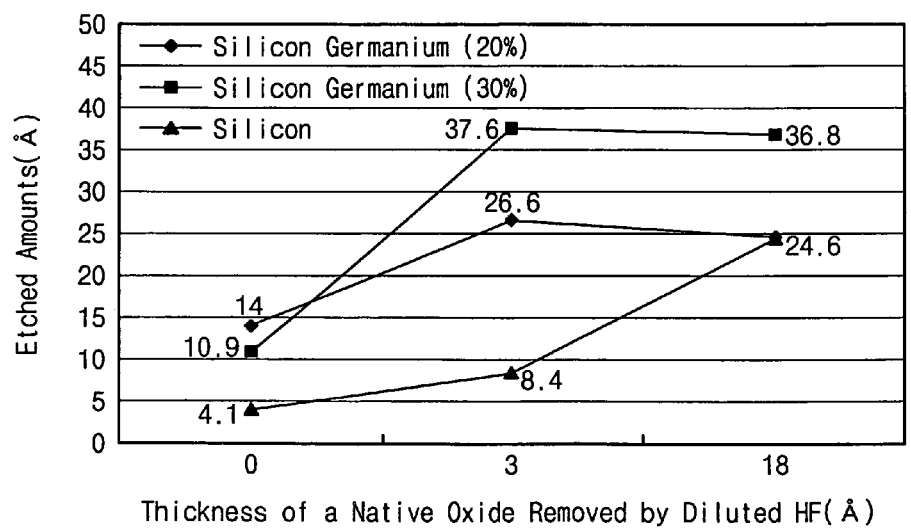
FIG. 2 is a graph of results of an experiment, wherein each value on a first axis of the graph represents the amount of silicon or silicon germanium that was etched from a wafer corresponding to that value, and each value on a second axis represents the amount of the thickness of a native oxide layer that was removed from a wafer corresponding to that value if the total thickness of the native oxide layer on that wafer was greater than or equal to the corresponding value (if the total thickness of a native oxide layer on a wafer is less than the value on the second axis corresponding to that wafer, then the entire native oxide layer on that wafer was removed)

Referring to FIG. 2, a different amount of silicon was etched from the first and second wafers of the first wafer group, a different amount of silicon germanium was etched from the first and second wafers of the second wafer group, and a different amount of silicon germanium was etched from the first and second wafers of the third wafer group. However, the amount of silicon etched from the third wafer of the first wafer group was substantially the same as the amount of silicon germanium (containing 20% germanium) etched from the third wafer of the second wafer group. After a first etching process is performed for an amount of time sufficient to remove 18 Å of a native oxide layer formed on a wafer, the entire native oxide layer has been removed from that wafer. Thus, as shown in FIG. 2, after the native oxide layer has been removed from the third wafer of the first wafer group and the third wafer of the second wafer group, the silicon layer and the first silicon germanium layer containing 20% germanium are etched at the same rate by the diluted solution SC1 described above.

In addition, it can be inferred from FIG. 2 that a native oxide layer having a thickness of about 3 Å is formed on the first silicon germanium layer of each wafer of the second wafer group, and a native oxide layer having a thickness of about 3 Å is formed on the second silicon germanium layer of each wafer of the third wafer group. Those thicknesses can be inferred because very little change in the amount of silicon germanium etched in the second etching process is observed between the second wafers of the second and third wafer groups (on each of which the first cleaning sub-process was performed for a time sufficient for a thickness of 3 Å of a native oxide layer to be removed) and the third wafers of the second and third wafer groups (on each of which the first cleaning sub-process was performed for a time sufficient for a thickness of 18 Å of a native oxide layer to be removed). That is, when the first cleaning sub-process is performed on a wafer of the second or third wafer group for an amount of time required to remove 3 Å of a native oxide layer, the first cleaning sub-process performed for that amount of time actually removes the entire native oxide layer formed on that wafer and exposes the silicon germanium layer of that wafer. Thus, the second etching process etches substantially the same amount of silicon germanium from the second and third wafers of the second wafer group, and etches substantially the same amount of silicon germanium from the second and third wafers of the third wafer group. Thus, the results illustrated in FIG. 2 suggest that reproducible cleaning results can be achieved when a native oxide layer is completely removed from a wafer.

A second experiment (Experiment 2) was performed to examine the influence that different cleaning solutions (i.e., cleaning solutions having different ratios of the substances contained therein) and different temperatures for the cleaning solutions have on the etching of a silicon layer, a first silicon germanium layer (containing 20% germanium), and a second silicon germanium layer (containing 30% germanium).

First, twenty seven bare wafers that were substantially the same were prepared. A silicon layer was then formed on nine of the bare wafers, and these wafers may be referred to herein as a first wafer group; a first silicon germanium layer containing 20% germanium was formed on another nine of the bare wafers, and these wafers may be referred herein to as a second wafer group; and a second silicon germanium layer containing 30% germanium was formed on still another nine bare wafers, and these wafers may be referred to herein as a third wafer group. Polysilicon was formed using the silicon layer. Each of the silicon layers, the first silicon germanium layers, and the second silicon germanium layers was formed having substantially the same thickness. Then surfaces of the wafers were forcibly contaminated using gel particles of a silicon nitride layer. A total twenty seven test wafers were formed through the process described above.

Subsequently, a first cleaning sub-process for removing a native oxide layer was performed on each of the twenty seven test wafers. The first cleaning sub-process was performed on each wafer for 120 seconds using a diluted fluoric acid at a temperature of 25° C. In the diluted fluoric acid, the volume ratio of deionized water to fluoric acid (49%) was 200:1. As used herein, when a substance name is followed by a percentage in parentheses (e.g., "fluoric acid (49%)"), the percentage in the parentheses represents the percentage of concentration for the corresponding substance. Thus, for example, "fluoric acid (49%)" means fluoric acid having a concentration percentage of fluoric acid of about 49%. After the first cleaning sub-process was performed, a second cleaning sub-process was performed on each of the test wafers for ten minutes using a diluted solution SC1. After the second cleaning sub-process, the amount of layer etching (i.e., "etched amount"), etching selectivities, and particle removal effectivenesss for the respective layers were measured. The various temperatures under which the second cleaning sub-process was performed and the cleaning solutions used at those temperatures are listed in Table 1 below along with the results yielded by using those pairs of temperatures and solutions.

TABLE 1

| Sub-exp. No. | Mixing ratio of diluted solution SC1 (ratio of ammonium hydroxide (NH$_4$OH) to hydrogen peroxide (H$_2$O$_2$) to deionized water) | Temperature of diluted solution SC1 (° C.) | Etched amount of silicon germanium (20%) (Å) | Etched amount of silicon germanium (30%) (Å) | Etched amount of silicon (Å) | Etching selectivity (first silicon germanium (20%)/silicon) | Etching selectivity (second silicon germanium (30%)/silicon) | Particle removal effectiveness (%) |
|---|---|---|---|---|---|---|---|---|
| 1 | 1:1:1,000 | 70 | 108.8 | 47.8 | 407.2 | 0.27 | 0.12 | 72.8 |
| 2 | 1:4:1,000 | 50 | 24.6 | 36.8 | 24.5 | 1.0 | 1.5 | 35.9 |
| 3 | 1:4:1,000 | 70 | 62.5 | 59.0 | 73.4 | 0.85 | 0.73 | 78.2 |
| 4 | 1:1:200 | 50 | 48 | 102.0 | 39.2 | 1.22 | 2.60 | 78.4 |
| 5 | 1:1:200 | 70 | 149.8 | 179.9 | 131.5 | 1.14 | 1.37 | 96.0 |
| 6 | 1:1:1,000 | 50 | 36.5 | 153.2 | 94.2 | 0.39 | 1.63 | 92.8 |
| 7 | 1:4:200 | 70 | 95 | 51.7 | 52.5 | 1.81 | 0.98 | 85.6 |
| 8 | 1:4:200 | 50 | 34.1 | 72.7 | 19.1 | 1.79 | 3.81 | 32.9 |
| 9 | 1:3:790 | 65 | 65.5 | — | 68.9 | 0.95 | — | 81.8 |

Referring to Table 1, a variety of etching selectivities and effective particle removal results are shown corresponding to cleaning temperature and solution pairs. A desired etching temperature and solution can be selected using the results shown in Table 1. For example, when a mixing ratio of a diluted solution SC1 (i.e., when the volume ratio of ammonium hydroxide (NH$_4$OH) to hydrogen peroxide (H$_2$O$_2$) to deionized water in the diluted solution SC1) is 1:1:1,000 and a temperature of the diluted solution SC1 is 70° C., an etching selectivity between the first silicon germanium layer and the silicon layer is 0.27 (i.e., the etched amount of the first silicon germanium layer divided by the etched amount of the silicon layer is 0.27), which is a relatively low value. However, an etching selectivity of 0.27 is better than an etching selectivity of 9, which is the etching selectivity between the first silicon germanium layer and the silicon layer when a conventional solution SC1 is used (for the conventional solution SC1, the ratio of the etching rate for the first silicon germanium layer to the etching rate for a silicon layer is 9:1). In addition, when the solution and temperature listed in Table 1 for Sub-experiment (Sub-exp.) No. 1 are used, particle removal effectiveness is about 72.8%, which is an excellent value.

Referring to Sub-exp. No. 2, when a mixing ratio of a diluted solution SC1 is 1:4:1,000 and temperature of the solution is 50° C., particle removal effectiveness is 35.9%, which is a relatively low value, but an etching selectivity between the first silicon germanium layer and the silicon layer is 1 under those conditions. Referring to experiment No. 9, when the mixing ratio of diluted solution SC1 is 1:3:790 and the temperature of the solution is 65° C., a relatively good particle removal effectiveness of 81.8% is achieved, and simultaneously, an etching selectivity between the first silicon germanium layer and the silicon layer is 0.95, which is relatively near an etching selectivity of 1. Also, referring to Sub-exp. No. 7, when the mixing ratio of diluted solution SC1 is 1:4:200 and the temperature of the solution is 70° C., a relatively good particle removal effectiveness of 85.6% is achieved, and simultaneously, an etching selectivity between the second silicon germanium layer with and the silicon layer is 0.98, which is near an etching selectivity of 1. Therefore, when a cleaning process is performed using one of the pairs of solutions and temperatures listed in Table 1, less of a silicon germanium layer is lost due to the cleaning process than when a conventional solution SC1 is used, so a reliable semiconductor device may be fabricated when a cleaning processes in accordance with one of those pairs is used in the fabrication process.

A process for forming a PiFET using a cleaning process in accordance with an embodiment of the invention will now be described with reference to FIGS. 3A to 3G.

Figure 3A:
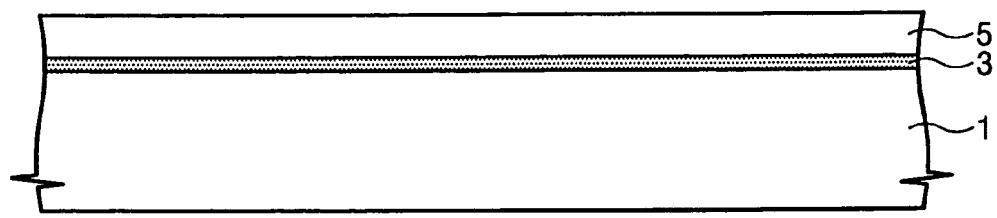
FIGS. 3A to 3G are cross-sectional views sequentially illustrating a method for fabricating a semiconductor device in accordance with an embodiment of the invention.

Referring to FIG. 3A, a silicon germanium layer 3 and a silicon layer 5 are sequentially formed on a semiconductor substrate 1. Silicon germanium layer 3 and silicon layer 5 may be formed using a selective epitaxial growth method. Silicon germanium layer 3 contains about 20% germanium.

Figure 3B:
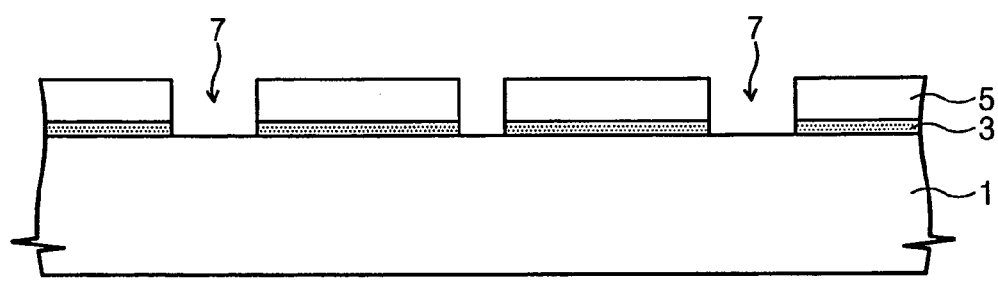

Referring to FIG. 3B, silicon layer 5 and silicon germanium layer 3 are sequentially etched using a mask pattern (not shown) as an etch mask to form first openings 7 that expose semiconductor substrate 1. Then, a cleaning process comprising first, second and third cleaning sub-processes is performed as follows. After the etching process, a first cleaning sub-process is performed to remove a native oxide layer formed on surfaces of semiconductor substrate 1, silicon germanium layer 3, and silicon layer 5 exposed by first openings 7. The first cleaning sub-process may be performed for 110 seconds using a first cleaning solution in which the volume ratio of deionized water at room temperature to fluoric acid (49%) is 500:1. Though the volume ratio of deionized water at room temperature to fluoric acid (49%) is 500:1 in the embodiment illustrated in FIG. 3, the volume ratio of deionized water at room temperature to fluoric acid (49%) may be 200:1-1,000:1. When the first cleaning sub-process is completed, the second cleaning sub-process may be performed for ten minutes, using a second cleaning solution at a temperature of 50° C. to remove by-products of the etching process and a layer damaged during the etching process. In the second cleaning solution, the volume ratio of ammonium hydroxide ($NH_4OH$) to hydrogen peroxide ($H_2O_2$) to deionized water is 1:4:1,000. Next, the third cleaning sub-process is performed using a diluted fluoric acid to remove an oxide layer formed by the hydrogen peroxide ($H_2O_2$) of the second cleaning solution during the second cleaning sub-process. The third cleaning sub-process is performed for 180 seconds using a third cleaning solution. The third cleaning solution is a diluted fluoric acid solution in which the volume ratio of deionized water to fluoric acid (49%) is 200:1. Although the volume ratio of deionized water to fluoric acid (49%) in the third cleaning solution is 200:1 in the embodiment illustrated with reference to FIG. 3, the volume ratio of deionized water to fluoric acid (49%) may be 200:1-1,000:1. Through the process described above, it is possible to perform a cleaning process that removes a remaining oxide layer, removes etching by-products, and does not remove an excessive amount of the silicon germanium layer.

Figure 3C:
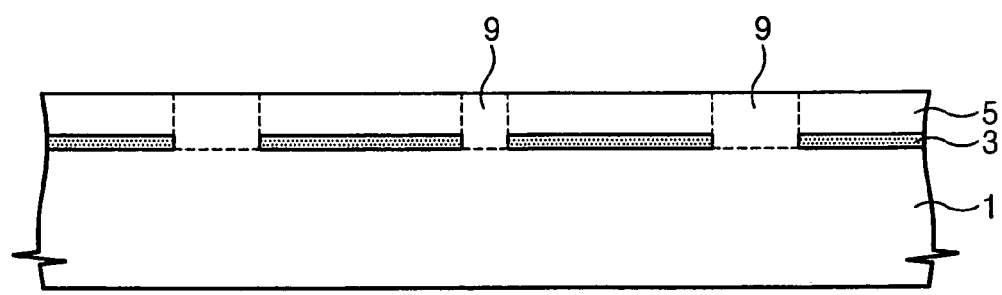

Referring to FIGS. 3B and 3C, first openings 7 are filled by forming a silicon epitaxial layer 9 in first openings 7 using a selective epitaxial growth method. Since there is no oxide layer on semiconductor substrate 1 due to the third cleaning sub-process, selective epitaxial growth can be performed effectively on semiconductor substrate 1. Silicon epitaxial layer 9 makes contact with semiconductor substrate 1, and is used as an electrical passage for heat, hot carriers, or back bias during a subsequent process.

Figure 3D:
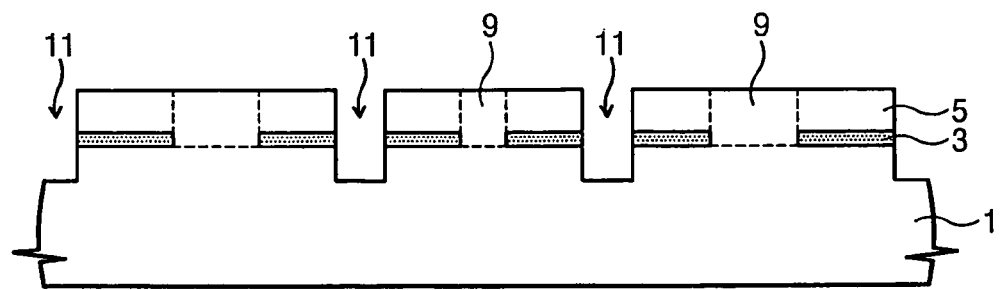

Referring to FIG. 3D, portions of silicon layer 5, silicon germanium layer 3, and semiconductor substrate 1 are sequentially etched to form second openings 11. Second openings 11 are formed using a different mask pattern (not shown) than the mask pattern used in forming first openings 7, and second openings 11 are disposed at different locations of semiconductor substrate 1 than first openings 7. Second openings 11 may be trenches for forming device isolation layers. The first and second cleaning sub-processes may be performed on semiconductor substrate 1 after second openings 11 have been formed.

Figure 3E:
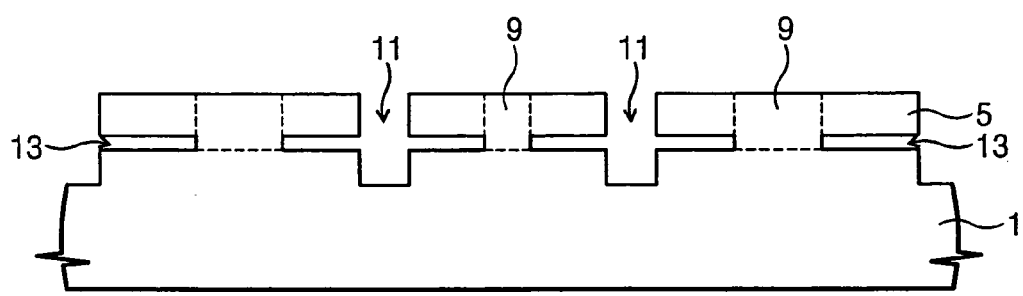

Referring to FIGS. 3D and 3E, silicon germanium layer 3, which is exposed by second openings 11, is selectively removed. Silicon germanium layer 3 may be removed using plasma of a gas selected from the group consisting of $H_2$, $N_2$, $O_2$, and a fluoric compound. Alternatively, silicon germanium layer 3 may be removed using a nitric acid solution or a conventional solution SC1 (i.e., a general solution SC1) having a volume ratio of ammonium hydroxide ($NH_4OH$) to hydrogen peroxide ($H_2O_2$) to deionized water of 1:4:20. When silicon germanium layer 3 is removed, third openings 13 exposing portions of silicon layer 5, semiconductor substrate 1, and silicon epitaxial layer 9 are formed where portions of silicon germanium layer 3 were previously disposed.

Figure 3F:
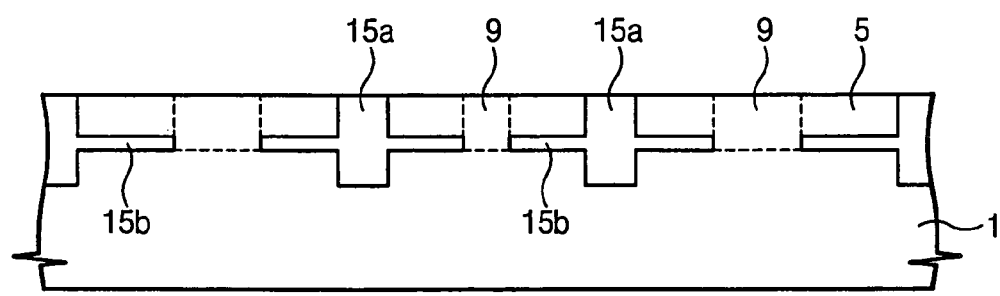
Figure 3G:
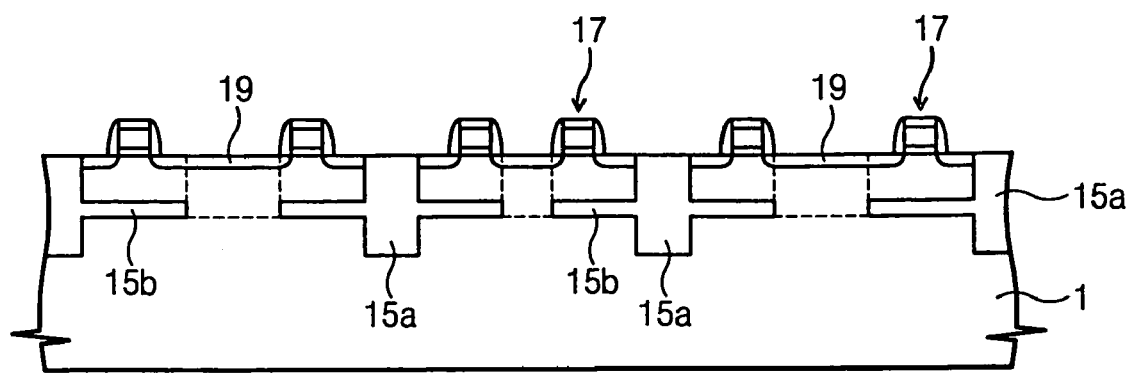

Referring to FIG. 3F, an insulation layer is formed in and on semiconductor substrate 1, thereby forming a device isolation layer 15a filling second openings 11 and simultaneously forming a buried insulation layer 15b filling third openings 13. Buried insulation layer 15b prevents punch-through potentially causing a short channel effect. Referring to FIG. 3G, a gate pattern 17 and source/drain regions 19 are formed on semiconductor substrate 1, and a PiFET is thereby formed.

An experiment performed to examine differences that result from fabricating a PiFET using a cleaning process in accordance with an embodiment of the invention in the fabrication process as opposed to fabricating a PiFET using a conventional cleaning process in the fabrication process will now be described.

In the experiment, two substantially similar test wafers were prepared. On each of the test wafers, a silicon germanium layer and a silicon layer were exposed as in the illustration of FIG. 3B. A conventional cleaning process was applied to a first test wafer of the test wafers, and a cleaning process in accordance with an embodiment of the invention was applied to a second test wafer of the test wafers. In accordance with the conventional cleaning process, the first test wafer was primarily cleaned for ten minutes using a conventional solution SC1 (i.e., a general solution SC1) at a temperature of 70° C., wherein the conventional solution SC1 had a volume ratio of ammonium hydroxide ($NH_4OH$) to hydrogen peroxide ($H_2O_2$) to deionized water of 1:4:20. Then, the first test wafer was secondarily cleaned for 90 seconds using a fluoric acid solution at room temperature, wherein the fluoric acid solution had a volume ratio of deionized water to fluoric acid (49%) of 500:1. In contrast, the cleaning process in accordance with an embodiment of the invention was performed on the second test wafer in substantially the same way as the cleaning process described with reference to FIG. 3B. That is, first through third cleaning sub-processes were performed as follows. A first cleaning sub-process was performed on the second test wafer for 110 seconds using a fluoric acid solution at room temperature, wherein the fluoric acid solution had a volume ratio of deionized water to fluoric acid (49%) of 500:1. A second cleaning sub-process was performed for ten minutes using a diluted solution SC1 at a temperature of 50° C., wherein diluted solution SC1 had a volume ratio of ammonium hydroxide ($NH_4OH$) to hydrogen peroxide ($H_2O_2$) to deionized water of 1:4:1,000. Subsequently, a third cleaning sub-process was performed for 180 seconds using a fluoric acid solution at room temperature, wherein the fluoric acid solution had a volume ratio of deionized water to fluoric acid (49%) of 200:1. Then, a silicon epitaxial layer was grown on each of the first and second test wafers using a selective epitaxial growth method, as is illustrated in FIG. 3C.

Figure 4:
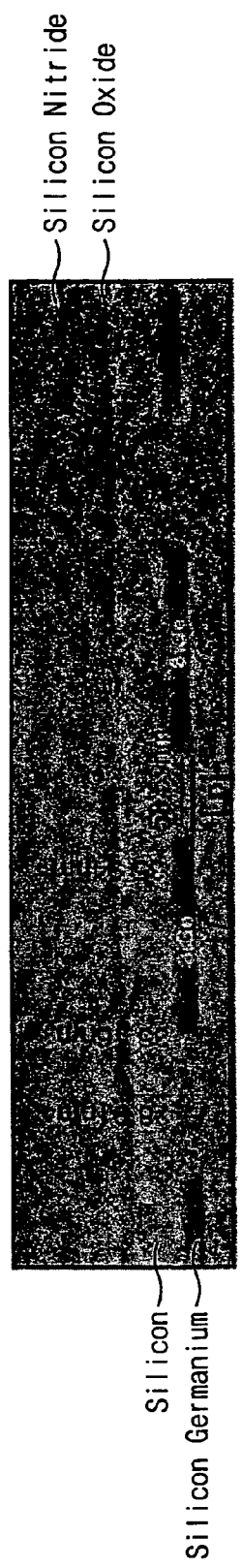
FIG. 4 is a photograph showing a cross-section of a test wafer after the conventional cleaning process has been performed on the test wafer and an epitaxial layer has been grown on the test wafer.
Figure 5:
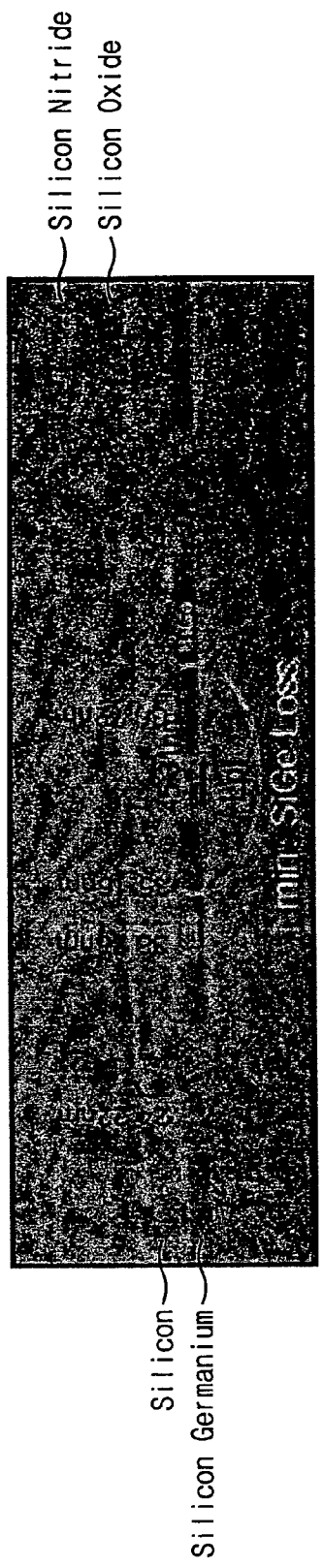
FIG. 5 is a photograph showing a cross-section of a test wafer after a cleaning process in accordance with an embodiment of the invention has been performed on the test wafer and an epitaxial layer has been grown on the test wafer.

The first and second test wafers were then cut, and the cross-sectional photographs shown in FIGS. 4 and 5 were obtained. FIG. 4 is a photograph showing a cross-section of the first test wafer after the conventional cleaning process has been performed on the first test wafer and an epitaxial layer has been grown on the first test wafer. FIG. 5 is a photograph showing a cross-section of the second test wafer after a cleaning process in accordance with an embodiment of the invention has been performed on the second test wafer and an epitaxial layer has been grown on the second test wafer.

Referring to FIGS. 4 and 5, a distance Lpi between the silicon germanium layers in FIG. 4 is 58.59 nm, while the distance Lpi between the silicon germanium layers in FIG. 5 is 45.31 nm, which is relatively short. Therefore, compared to when a conventional cleaning process is performed in the fabrication of a PiFET, damage caused to the silicon germanium layers is relatively small when a cleaning process in accordance with an embodiment of the invention is performed as in the fabrication of a PiFET. The silicon oxide layers and the silicon nitride layers shown in FIGS. 4 and 5 serve as capping layers, which are intended to protect the silicon layer and the silicon germanium layers when each of the test wafers is cut.

A process for fabricating an MBC-FET using a cleaning process in accordance with an embodiment of the invention will now be described with reference to FIGS. 6A to 6E.

Figure 6A:
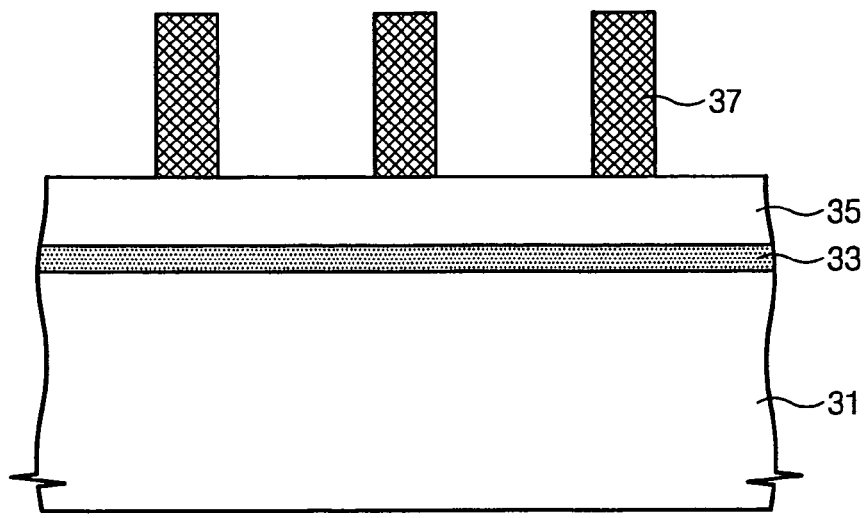
FIGS. 6A to 6E are cross-sectional views sequentially illustrating a method for fabricating a semiconductor device in accordance with another embodiment of the invention.

Referring to FIG. 6A, a silicon germanium layer 33 and a silicon layer 35 are sequentially formed on a semiconductor substrate 31. Silicon germanium layer 33 and silicon layer 35 may be formed using a selective epitaxial growth method. A mask pattern 37 is formed on silicon layer 35 using a silicon nitride layer. Silicon germanium layer 33 contains 20% germanium.

Figure 6B:
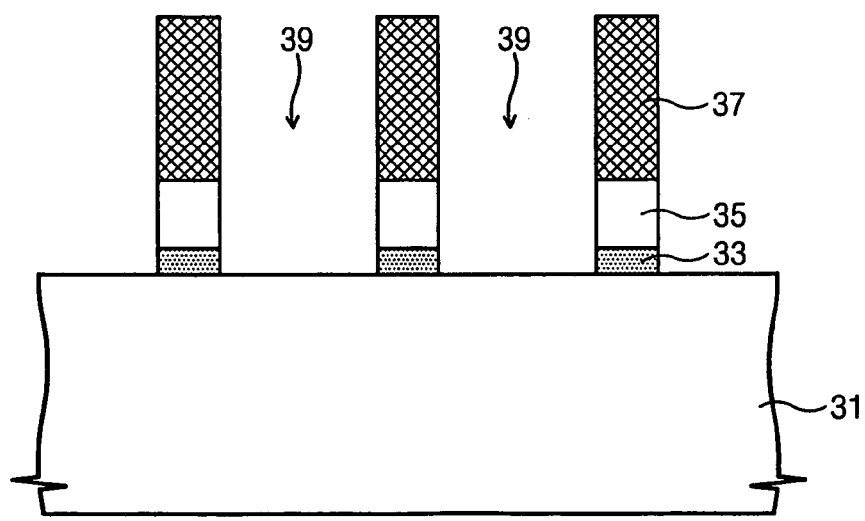

Referring to FIG. 6B, silicon layer 35 and silicon germanium layer 33 are sequentially etched using mask patterns 37 as an etch mask to form first openings 39 that expose semiconductor substrate 31. First, second, and third cleaning sub-processes, which are substantially the same as those described with reference to FIG. 3B, are then performed on semiconductor substrate 1.

Figure 6C:
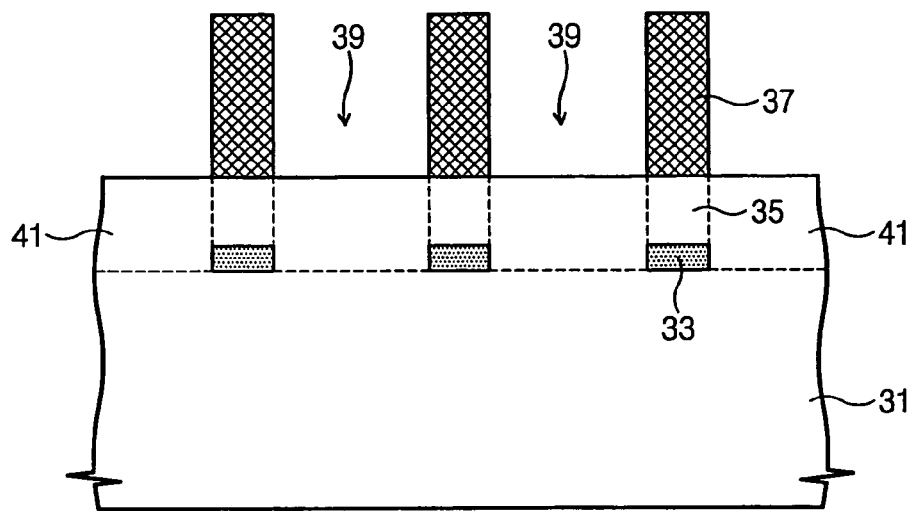
Figure 6D:
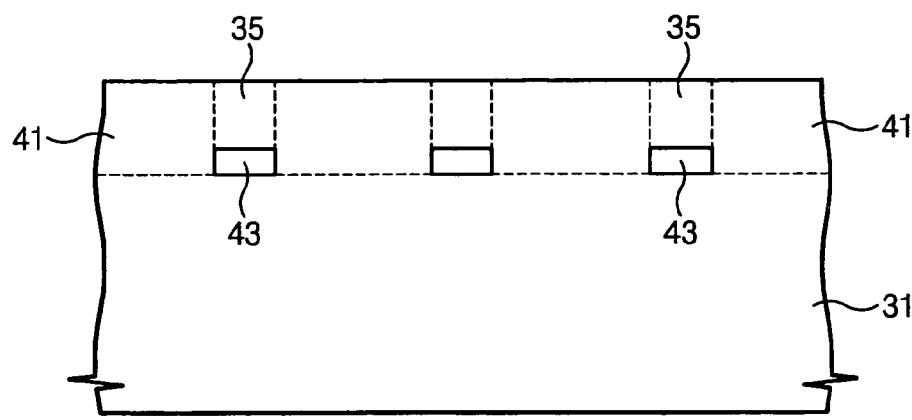

Referring to FIGS. 6C and 6D, a silicon epitaxial layer 41 is formed in first openings 39 using a selective crystal growth method in order to fill first openings 39. Silicon epitaxial layer 41 makes contact with semiconductor substrate 31 and will subsequently become source/drain regions. After silicon epitaxial layer 41 is formed, mask pattern 37 is removed.

Referring to FIG. 6D, portions of silicon layer 35 remain on semiconductor substrate 31, and portions of those remaining portions of silicon layer 35 are etched using a second mask pattern (not shown) as an etch mask to form second openings (not shown) that expose at least silicon germanium layer 33. The second mask pattern is different than mask pattern 37, and the second openings are disposed over different areas of semiconductor substrate 31 than the areas of semiconductor substrate 31 over which first openings 39 were disposed. Though multiple second openings are formed, for convenience of description, in general, reference will only be made to one of the second openings, which will be referred to herein as "the second opening." The first and second cleaning sub-processes may then be performed on semiconductor substrate 31 in which the second opening (i.e., one of the second openings) is formed. Silicon germanium layer 33 exposed by the second opening is then selectively removed. When silicon germanium layer 33 exposed by the second opening is selectively removed, a third opening 43 that exposes silicon layer 35, semiconductor substrate 31, and silicon epitaxial layer 41 is formed where silicon germanium layer 33 was previously disposed.

Figure 6E:
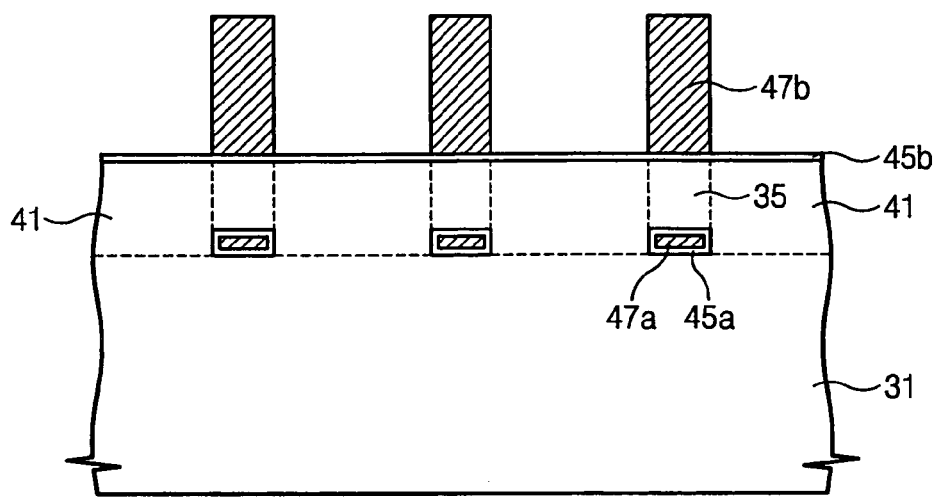

Referring to FIGS. 6D and 6E, a thermal oxidation process is performed on semiconductor substrate 31 on which the second opening (not shown) and third opening 43 are formed in order to conformally form a gate insulation layer 45a, 45b on surfaces of silicon layer 35, semiconductor substrate 31, and silicon epitaxial layer 41 exposed by the second opening and third opening 43. Gate insulation layer 45a, 45b comprises a conformal first gate insulation layer 45a disposed on an inner wall of third opening 43 and a second gate insulation layer 45b disposed on an inner wall of the second opening (not shown) and on an upper surface of semiconductor substrate 31. Also, a gate conductive layer is formed (to fill the second opening and third opening 43) and patterned in order to form a first gate electrode 47a inside third opening 43 and a second gate electrode 47b on semiconductor substrate 31. Though it is not shown in FIG. 6, first gate electrode 47a is connected to second gate electrode 47b via the second opening (not shown). Subsequently, ion implantation is performed to form source/drain regions (not shown). An MBC-FET may be fabricated through the process described above.

An experiment performed to examine differences that result from fabricating an MBC-FET using a cleaning process in accordance with an embodiment of the invention in the fabrication process as opposed to fabricating an MBC-FET using a conventional cleaning process in the fabrication process will now be described.

In the experiment, two substantially similar test wafers were prepared. On each of the test wafers, a silicon germanium layer and a silicon layer were exposed as in the illustration of FIG. 6B. A conventional cleaning process was applied to a first test wafer of the test wafers, and a cleaning process in accordance with an embodiment of the invention was applied to a second test wafer of the test wafers. In accordance with the conventional cleaning process, the first test wafer was first cleaned for ten minutes using a conventional solution SC1 (i.e., a general solution SC1) at a temperature of 70° C., wherein the conventional solution SC1 had a volume ratio of ammonium hydroxide ($NH_4OH$) to hydrogen peroxide ($H_2O_2$) to deionized water of 1:4:20. Then, a second cleaning was performed in which the first test wafer was cleaned for 90 seconds using a fluoric acid solution at room temperature, wherein the fluoric acid solution had a volume ratio of deionized water to fluoric acid (49%) of 500:1.

In contrast, the cleaning process in accordance with an embodiment of the invention was performed in substantially the same way as the cleaning process mentioned with reference to FIG. 6B (i.e., the cleaning process described with reference to FIG. 3B). That is, first through third cleaning sub-processes were performed as follows. A first cleaning sub-process was performed for 110 seconds on the second test wafer using a fluoric acid solution at room temperature, wherein the volume ratio of deionized water to fluoric acid (49%) was 500:1. A second cleaning sub-process was performed for ten minutes using a diluted solution SC1 at a temperature of 50° C., wherein diluted solution SC1 had a volume ratio of ammonium hydroxide ($NH_4OH$) to hydrogen peroxide ($H_2O_2$) to deionized water of 1:4:1,000. Subsequently, a third cleaning sub-process was performed for 180 seconds using a diluted fluoric acid solution at room temperature, wherein the fluoric acid solution had a volume ratio of deionized water to fluoric acid (49%) of 200:1. Also, a silicon epitaxial layer was grown on each of the first and second test wafers using a selective epitaxial growth method, as in the illustration of FIG. 6C.

Figure 7:
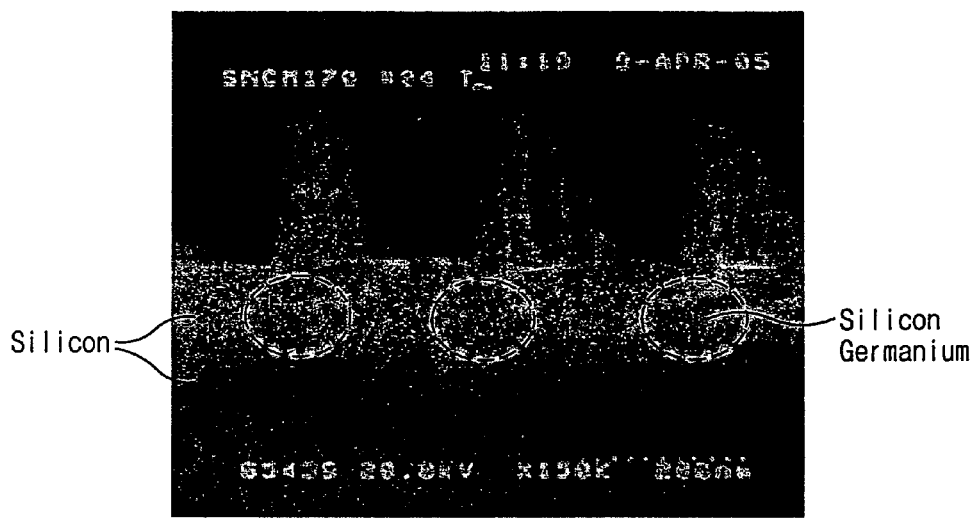
FIG. 7 is a photograph showing a cross-section of a test wafer after the conventional cleaning process has been performed on the test wafer and an epitaxial layer has been grown on the test wafer; and, FIG. 8 is a photograph showing a cross-section of the test wafer after a cleaning process in accordance with an embodiment of the invention has been performed on the test wafer and an epitaxial layer has been grown on the test wafer.
Figure 8:
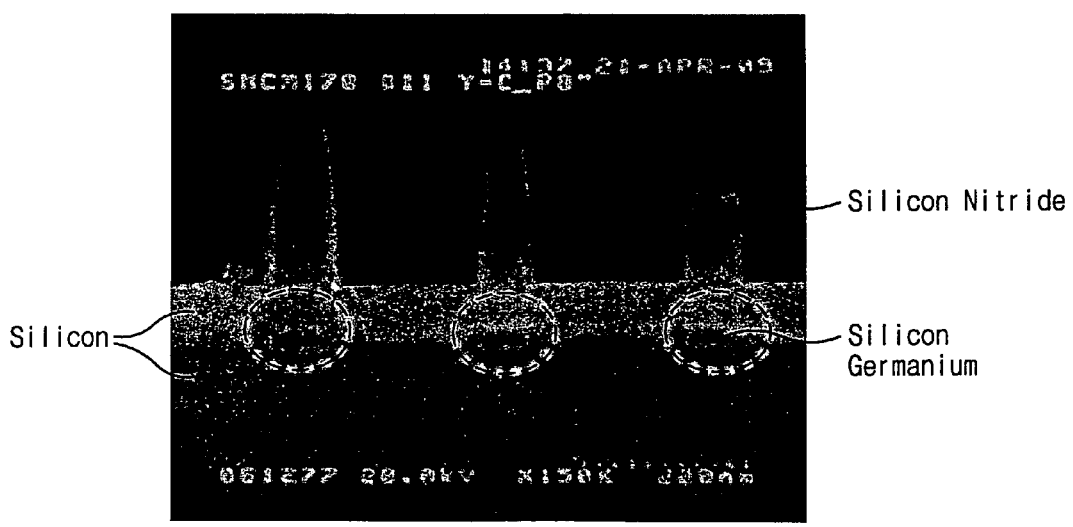

The first and second wafers were then cut, and the cross-sectional photographs shown in FIGS. 7 and 8 were obtained. FIG. 7 is a photograph showing a cross-section of the first test wafer after the conventional cleaning process has been performed on the first test wafer and an epitaxial layer has been grown on the first test wafer. FIG. 8 is a photograph showing a cross-section of the second test wafer after a cleaning process in accordance with an embodiment of the invention has been performed on the second test wafer and an epitaxial layer has been grown on the second test wafer.

Referring to FIGS. 7 and 8, relatively little silicon germanium can be seen inside the dotted circles illustrated in FIG. 7, while silicon germanium can be clearly seen in a bar shape inside each of the dotted circles illustrated in FIG. 8. Therefore, FIG. 7 shows that much silicon germanium was lost as a result of the conventional cleaning process, while FIG. 8 shows that, when a cleaning process in accordance with an embodiment of the invention was performed, the cleaning process in accordance with an embodiment of the invention caused relatively little damage to a silicon germanium layer compared to the conventional cleaning process.

Various features of a cleaning process in accordance with an embodiment(s) of the invention will now be described. The first cleaning solution may be a solution (i.e., a mixed solution) comprising deionized water ($H_2O$) and hydrofluoric acid (HF). The concentration of HF in the first cleaning solution may be 49%, and a volume ratio of deionized water ($H_2O$) to the HF contained in the first cleaning solution may be 5:1-3,000:1. In addition, the first cleaning sub-process may be performed for 10-600 seconds. In particular, the volume ratio of deionized water ($H_2O$) to the HF contained in the first cleaning solution may be 200:1-1,000:1, and the first cleaning sub-process may be performed for 30-300 seconds. The temperature of the first cleaning solution may be 10-40° C. during the first cleaning sub-process.

The cleaning process may further comprise performing an overflow rinse process on the semiconductor substrate using deionized water ($H_2O$) at room temperature for 5-20 minutes after performing the first cleaning sub-process.

The concentration of each of the ammonium hydroxide ($NH_4OH$) and the hydrogen peroxide ($H_2O_2$) contained in the second cleaning solution may be 35%. In addition, the volume ratio of ammonium hydroxide ($NH_4OH$) to hydrogen peroxide ($H_2O_2$) contained in the second cleaning solution may be 2:1-1:10, and the volume ratio of ammonium hydroxide ($NH_4OH$) to deionized water ($H_2O$) contained in the second cleaning solution may be 1:5-1:2,000. In particular, the volume ratio of ammonium hydroxide ($NH_4OH$) to hydrogen peroxide ($H_2O_2$) contained in the second cleaning solution may be 1:1-1:4, and the volume ratio of ammonium hydroxide ($NH_4OH$) to deionized water ($H_2O$) contained in the second cleaning solution may be 1:200-1:1,000. The temperature of the second cleaning solution may be 10-80° C. in the second cleaning sub-process, and the second cleaning sub-process may be performed for 1-1,200 seconds. In particular, the temperature of the second cleaning solution may be 50-70° C. during the second cleaning sub-process, and the second cleaning sub-process may be performed for 180-600 seconds.

The cleaning process may further comprise performing an overflow rinse process or a quick dump rinse process using deionized water ($H_2O$) at room temperature for 5-20 minutes after performing the first cleaning sub-process.

When an epitaxial layer is not grown after the rinse process subsequent to the second cleaning sub-process, the cleaning process may further comprise, after performing the rinse process, an operation of drying the semiconductor substrate using isopropyl alcohol or drying the semiconductor substrate by rotating the semiconductor substrate.

The cleaning method may further comprise performing a third cleaning sub-process on the semiconductor substrate using a third cleaning solution to remove an oxide layer after performing the second cleaning sub-process. The oxide layer may be a layer formed by hydrogen peroxide contained in the second cleaning solution that was used during the second cleaning sub-process. The third cleaning solution may be similar to or the same as the first cleaning solution. That is, the third cleaning solution may be a mixed solution of deionized water and fluoric acid. The concentration of fluoric acid contained in the third cleaning solution may be 49%. The volume ratio of deionized water to fluoric acid contained in the third cleaning solution may be 5:1-3,000:1, and the third cleaning sub-process may be performed for 10-600 seconds. In particular, the volume ratio of deionized water to fluoric acid contained in the third cleaning solution may be 200:1-1,000:1, and the third cleaning sub-process may be performed for 30-300 seconds. During the third cleaning sub-process, the temperature of the third cleaning solution may be in a range of 10-40° C.

The cleaning method may further comprise performing an overflow rinse process on the semiconductor substrate using deionized water at room temperature for 5-20 minutes after performing the third cleaning sub-process.

The cleaning method may still further comprise, after performing the rinse process subsequent to the third cleaning sub-process, an operation of drying the semiconductor substrate using isopropyl alcohol and a nitrogen gas or drying the semiconductor substrate by rotating the semiconductor substrate.

In the specification, the overflow rinse process may be a process of continuously supplying a cleaning solution such as deionized water though a bottom of a cleaning tub while a wafer is in the cleaning tub, and allowing the cleaning solution to flow out of (i.e., over) the cleaning tub, thereby removing particles and residual cleaning solution disposed on a surface of the wafer. The quick dump process may be a process in which, while a wafer is disposed in a cleaning tub containing cleaning solution, the cleaning solution (such as deionized water) is drained to an outlet port of the cleaning tub in order to lower a level of the cleaning solution and remove particles and a residual cleaning solution on a surface of the wafer.

At least the first and third cleaning sub-processes may be performed in-situ in one cleaning chamber. That is, the first and third cleaning sub-processes may be performed in-situ in a first cleaning chamber, and the second cleaning sub-process may be performed in a second cleaning chamber. Alternatively, each of the first to third cleaning sub-processes may be performed in-situ in one cleaning chamber. Each of the first to third cleaning sub-processes may be performed using at least one method selected from the group consisting of a spin-spray method, a spin method, a spin method including application of deionized (DI) sonic energy, a dip method, and a dip method including application of mega sonic energy. As used herein, the spin-spray method may be a method of rotating a wafer and spraying a cleaning solution onto the wafer in order to perform a cleaning process. The spin method may be a method of rotating a wafer and spraying a cleaning solution onto the wafer through a nozzle in order to perform a cleaning process. The spin method including DI sonic energy may be a method of applying DI sonic energy to a cleaning solution used when performing the spin method in order to perform a cleaning process. The dip method may be a method of dipping a wafer into a cleaning solution contained in a cleaning tub to perform a cleaning process. The dip method including mega sonic energy may be a method of applying mega sonic energy to a cleaning solution used when performing the dip method in order to perform a cleaning process.

In addition, in a process for fabricating a semiconductor device in accordance with an embodiment of the invention, the amount of germanium contained within a silicon germanium layer formed on a semiconductor substrate may be 1-99% of the entire mass of the silicon germanium layer.

In accordance with a method for cleaning a substrate on which a silicon layer and a silicon germanium layer are formed and exposed, and a method for fabricating a semiconductor device using the method for cleaning the substrate, a native oxide layer formed on exposed surfaces of the silicon layer and the germanium is first removed during the cleaning process. Then, etching-damaged layers of the silicon layer and the silicon germanium layer and by-products of the silicon layer and the silicon germanium layer are effectively removed using a cleaning solution SC1 in accordance with an embodiment of the invention having an etching selectivity between the silicon germanium layer and the silicon layer of 0.5-2. The cleaning solution SC1 in accordance with an embodiment of the invention may comprise two hundred or more times more deionized water than ammonium hydroxide ($NH_4OH$). Because the entire native oxide layer is removed during the cleaning process before the silicon layer and the silicon germanium layer are cleaned, the silicon layer and the silicon germanium layer are cleaned under the same conditions for each wafer cleaned, so the same (i.e., uniform) results may be expected for each wafer cleaned. Also, since the cleaning solution SC1 in accordance with an embodiment of the invention has an etching selectivity between the silicon germanium layer and the silicon layer of 0.5-2, the loss of a relatively great amount of the silicon germanium layer, which is associated with the conventional cleaning process, can be prevented in a cleaning process in accordance with an embodiment of the invention. Therefore, a buried insulation layer having a desired length can be obtained when using a cleaning process in accordance with an embodiment of the invention. In addition, a channel having a desired length can also be obtained when using a cleaning process in accordance with an embodiment of the invention. Thus, reliable semiconductor devices can be fabricated through the method for fabricating the semiconductor device that uses a cleaning process in accordance with an embodiment of the invention.

Various modifications can be made to the embodiments described herein by those skilled in the art without departing from the scope of the invention as defined by the accompanying claims. In addition, variations of the embodiments described herein may be made by those skilled in the art without departing from the scope of the invention as defined by the accompanying claims.

What is claimed is:

1. A cleaning method comprising:
   preparing a semiconductor substrate, wherein a silicon layer and a silicon germanium layer are formed on the semiconductor substrate, and the silicon layer and the silicon germanium layer are each exposed;
   performing a first cleaning sub-process, wherein the first cleaning sub-process comprises using a first cleaning solution to remove a native oxide layer from the semiconductor substrate; and,
   performing a second cleaning sub-process on the semiconductor substrate after performing the first cleaning sub-process, wherein the second cleaning sub-process comprises using a second cleaning solution,
   wherein the second cleaning solution comprises ammonium hydroxide ($NH_4OH$), hydrogen peroxide ($H_2O_2$), and deionized water ($H_2O$), and the second cleaning solution comprises at least 200 times more deionized water ($H_2O$) than ammonium hydroxide ($NH_4OH$) by volume.

2. The method of claim 1, wherein the first cleaning solution comprises deionized water ($H_2O$) and hydrofluoric acid (HF).

3. The method of claim 2, wherein:
   a concentration of the HF is about 49%; and,
   a volume ratio of deionized water ($H_2O$) to HF is 200:1-1,000:1.

4. The method of claim 3, wherein:
   a temperature of the first cleaning solution is in a range of 10-40° C. during the first cleaning sub-process; and,
   the first cleaning sub-process is performed for 30-300 seconds.

5. The method of claim 1, wherein:
   the concentration of each of the ammonium hydroxide ($NH_4OH$) and the hydrogen peroxide ($H_2O_2$) of the second cleaning solution is 35%;
   a volume ratio of ammonium hydroxide ($NH_4OH$) to hydrogen peroxide ($H_2O_2$) is 1:1-1:4; and,
   a volume ratio of ammonium hydroxide ($NH_4OH$) to deionized water ($H_2O$) is 1:200-1:1,000.

6. The method of claim 5, wherein:
a temperature of the second cleaning solution is in a range of 50-70° C. during the second cleaning sub-process; and,
the second cleaning sub-process is performed for 180-600 seconds.

7. The method of claim 1, further comprising performing a third cleaning sub-process after performing the second cleaning sub-process, wherein performing the third cleaning sub-process comprises using a third cleaning solution to remove an oxide layer.

8. The method of claim 7, wherein the third cleaning solution comprises deionized water ($H_2O$) and hydrofluoric acid (HF).

9. The method of claim 8, wherein:
a concentration of the HF of the third cleaning solution is 49%; and,
a volume ratio of deionized water ($H_2O$) to HF is 200:1-1,000:1.

10. The method of claim 9, wherein:
a temperature of the third cleaning solution is in a range of 10-40° C. during the third cleaning sub-process; and,
the third cleaning sub-process is performed for 30-300 seconds.

11. The method of claim 7, wherein at least the first and third cleaning sub-processes are performed in-situ.

12. A method for fabricating a semiconductor device, the method comprising:
sequentially forming a silicon germanium layer and a silicon layer on a semiconductor substrate;
patterning the silicon layer and the silicon germanium layer to form the first opening that exposes the silicon layer, the silicon germanium layer, and the semiconductor substrate;
performing a first cleaning sub-process on surfaces of the silicon layer, the silicon germanium layer, and the semiconductor substrate exposed by a first opening using a first cleaning solution to remove a native oxide layer; and,
performing a second cleaning sub-process on the semiconductor substrate using a second cleaning solution after performing the first cleaning sub-process,
wherein the second cleaning solution comprises ammonium hydroxide ($NH_4OH$), hydrogen peroxide ($H_2O_2$), and deionized water ($H_2O$), and the second cleaning solution comprises 200 times more deionized water ($H_2O$) than ammonium hydroxide ($NH_4OH$) by volume.

13. The method of claim 12, further comprising performing a third cleaning sub-process to remove an oxide layer after performing the second cleaning sub-process, wherein the third cleaning sub-process comprises using a third cleaning solution.

14. The method of claim 13, further comprising, after performing the third cleaning sub-process:
growing an epitaxial layer inside the first opening to fill the first opening;
patterning the silicon layer to form a second opening that exposes at least the silicon germanium layer;
performing the first cleaning sub-process;
performing the second cleaning sub-process;
removing the silicon germanium layer to form a third opening disposed between the silicon layer and the semiconductor substrate, and connected to the second opening;
conformally forming a gate insulation layer on surfaces of the silicon layer and the semiconductor substrate exposed by the second and third openings; and,
forming a gate conductive layer to fill the second and third openings.

15. The method of claim 14, wherein the first cleaning solution comprises deionized water ($H_2O$) and hydrofluoric acid (HF).

16. The method of claim 15, wherein:
a concentration of the HF of the first cleaning solution is 49%; and,
a volume ratio of deionized water ($H_2O$) to HF in the first cleaning solution is 200:1-1,000:1.

17. The method of claim 16, wherein:
a temperature of the first cleaning solution is in a range of 10-40° C. during the first cleaning sub-process; and,
the first cleaning sub-process is performed for 30-300 seconds.

18. The method of claim 14, wherein:
the concentration of each of ammonium hydroxide ($NH_4OH$) and hydrogen peroxide ($H_2O_2$) of the second cleaning solution is 35%;
a volume ratio of ammonium hydroxide ($NH_4OH$) to hydrogen peroxide ($H_2O_2$) in the second cleaning solution is 1:1-1:4; and,
a volume ratio of ammonium hydroxide ($NH_4OH$) to deionized water ($H_2O$) in the second cleaning solution is 1:200-1:1,000.

19. The method of claim 18, wherein:
a temperature of the second cleaning solution is in a range of 50-70° C.; and,
the second cleaning sub-process is performed for 180-600 seconds.

20. The method of claim 13, further comprising, after performing the third cleaning sub-process:
growing an epitaxial layer in the first opening to fill the first opening;
patterning the silicon layer to form a second opening that exposes at least the silicon germanium layer;
performing the first cleaning sub-process;
performing the second cleaning sub-process;
removing the silicon germanium layer to form a third opening disposed between the silicon layer and the semiconductor substrate, and connected to the second opening; and,
forming an insulation layer filling the second and third openings.

21. The method of claim 20, wherein:
the concentration of each of ammonium hydroxide ($NH_4OH$) and hydrogen peroxide ($H_2O_2$) of the second cleaning solution is 35%;
a volume ratio of ammonium hydroxide ($NH_4OH$) to hydrogen peroxide ($H_2O_2$) in the second cleaning solution is 1:1-1:4; and,
a volume ratio of ammonium hydroxide ($NH_4OH$) to deionized water ($H_2O$) in the second cleaning solution is 1:200-1:1,000.

22. The method of claim 21, wherein:
a temperature of the second cleaning solution is in a range of 50-70° C.; and,
the second cleaning sub-process is performed for 180-600 seconds.

23. The method of claim 13, wherein the third cleaning solution comprises deionized water ($H_2O$) and hydrofluoric acid (HF).

24. The method of claim 23, wherein:
a concentration of the HF of the third cleaning solution is 49%; and,
a volume ratio of deionized water ($H_2O$) to HF in the third cleaning solution is 200:1-1,000:1.

25. The method of claim 24, wherein:
a temperature of the third cleaning solution is in a range of 10-40° C. during the third cleaning sub-process; and, the third cleaning sub-process is performed for 30-300 seconds.

26. The method of claim 12, wherein at least the first and third cleaning sub-processes are performed in-situ.

* * * * *